United States Patent [19]
Kalfus et al.

[11] Patent Number: 5,001,545
[45] Date of Patent: Mar. 19, 1991

[54] FORMED TOP CONTACT FOR NON-FLAT SEMICONDUCTOR DEVICES

[75] Inventors: Martin Kalfus; Eugene L. Foutz, both of Scottsdale, Ariz.

[73] Assignee: Motorola, Inc., Schaumberg, Ill.

[21] Appl. No.: 243,363

[22] Filed: Sep. 9, 1988

[51] Int. Cl.$^5$ ............................................. H01L 29/60
[52] U.S. Cl. ........................................ 357/70; 357/68; 437/220
[58] Field of Search ................. 357/68, 70, 69, 67; 437/187, 206, 209, 214, 217, 220; 361/404, 405, 406, 421, 408

[56] References Cited

U.S. PATENT DOCUMENTS

| | | | |
|---|---|---|---|
| 3,290,564 | 12/1966 | Wolff, Jr. | 317/234 |
| 3,478,420 | 12/1968 | Grimes et al. | 29/588 |
| 3,500,136 | 1/1968 | Fischer | 317/234 |
| 3,569,797 | 3/1971 | Simmons | 317/234 |
| 3,763,403 | 3/1972 | Lootens | 317/234 |
| 4,012,765 | 9/1975 | Lehner et al. | 357/70 |
| 4,117,508 | 9/1978 | Koenig | 357/81 |
| 4,158,745 | 6/1979 | Keller | 174/52 |
| 4,252,864 | 2/1981 | Coldren | 428/571 |
| 4,346,396 | 8/1982 | Carroll, II et al. | 357/70 |
| 4,616,412 | 10/1986 | Schroeder | 357/70 |
| 4,631,820 | 12/1986 | Harada et al. | 361/405 |
| 4,827,376 | 5/1989 | Voss | 361/421 |

FOREIGN PATENT DOCUMENTS

| | | | |
|---|---|---|---|
| 3528427 | 4/1987 | Fed. Rep. of Germany | 357/68 |
| 0019627 | 2/1981 | Japan | 437/209 |
| 0027941 | 3/1981 | Japan | 437/220 |
| 0234061 | 10/1986 | Japan | 437/220 |

*Primary Examiner*—Rolf Hille
*Assistant Examiner*—Minh Loan Tran
*Attorney, Agent, or Firm*—Robert M. Handy

[57] ABSTRACT

An improved contact is obtained to power devices having a raised dielectric region adjacent the die contact region by providing a contact dimple on the otherwise flat metal lead used for die contact. The dimple is arranged above the die contact and soldered thereto. The radius of curvature and depth of the dimple is adjusted so that the contact lead is far enough away from the edge of the surrounding raised dielectric at the edge of the die contact to provide a laterally concave outwardly air-solder interface in that location. This prevents solder creep onto the dielectric surface and avoids die edge shorting. Several dimple shapes are described.

14 Claims, 2 Drawing Sheets

FORMED TOP CONTACT FOR NON-FLAT SEMICONDUCTOR DEVICES

BACKGROUND OF THE INVENTION

1. Field of the Invention

This invention relates in general to electronic devices and, more particularly, to improved means and methods for providing leads to semiconductor or other electronic chips. As used herein the words device or devices are intended to refer to all kinds of electronic devices and integrated circuits which use connection means and leads of the sort described herein, including but not limited to semiconductor based devices.

2. Background Art

In the electronics art, particularly the semiconductor device and circuit art, it is commonplace to provide light weight leads to devices that primarily function for signal processing and heavy leads to devices that carry substantial current. Wire bonding of thin wires and tab bonding of metal foils are examples of techniques commonly used for signal processing devices. Such wires or foils generally carry only microamperes or milliamperes, are typically a mil to a few mils thick, and are generally welded directly to the bonding pads on the device.

With higher current devices, such as power diodes and transistors or integrated circuits where currents of amperes to tens or hundreds of amperes are required, the leads bonded to the device must be more robust. It is commonplace to use metal leads that are of the order of ten to hundreds of mils thick. They are frequently attached by soldering to the bonding areas on the device.

When the device to be connected has an irregular surface, it becomes more difficult to attach such heavy leads without creating failure modes which can reduce manufacturing yield and reliability. For example, when power semiconductor die are manufactured using masking and/or passivating dielectrics the bonding pads may be partially surrounded by a raised dielectric whose outer surface is higher than the bonding pad surface. When the usual prior art flat leads are soldered to such a bonding pad, the solder volume and spreading is difficult to control. Solder runout on the dielectric surface becomes more likely and bridging of the solder around the edge of the chip may cause electrical shorts that render the device inoperative or unreliable. Thus, a problem continues to exist in bonding heavy leads to power devices where the bonding pad or other connection point is recessed below the adjacent outer surface, for example, where the bonding pad is at least partially surrounded by a dielectric or other material not intended to contact the lead and of greater elevation relative to the substrate surface than the bonding pad.

Accordingly, it is an object of the present invention to provide an improved means and method for bonding leads to devices having a bonding pad or contact region which is depressed relative to at least part of the outer surface of the surrounding region of the device.

It is a further object of the present invention to provide an improved means and method for bonding leads to semiconductor devices, as above, and which also can carry continuous currents of about an ampere or more.

It is an additional object of the present invention to provide an improved means and method for bonding leads to devices, as above, and which are desired to be attached by use of solders.

It is a further object of the present invention to provide an improved means and method for bonding leads to devices, as above, while maintaining close die-lead spacing and solder filling of the bonding pad and lead-bonding pad space, so as to enhance the surge capability of the device.

As used herein the words solder or solders are intended to include any electrically conductive attachment material which is semi-solid or at least partially liquid at some time during the lead attachment process. Non-limiting examples are conventional metal or metal alloys or metal loaded epoxies or other conductive plastics or glasses, and the like.

SUMMARY OF THE INVENTION

Attainment of the foregoing and other objects and advantages is provided through the present invention comprising an electronic die having opposed first and second faces where the second face has a bonding pad depressed relative to at least part of the adjacent outer surface of the die, an electrode means having a first portion for mounting the die and a second portion for bonding to the bonding location where the second portion is at least partly dimpled or curved toward the bonding pad, and an electrically conductive attachment material for bonding the at least partly dimpled or curved second portion to the bonding pad without extending onto the adjacent outer surface away from the bonding pad.

The forgoing improved electronic device is desirably fabricated by providing a semiconductor die having a depressed bonding pad on a surface, providing a lead means having a die mounting portion and having a dimpled or curved bonding portion, attaching the die to the mounting portion, and attaching the dimpled or curved portion of the lead means to the bonding pad by an electrically conductive material which does not extend onto the device surface laterally outside the bonding pad. The two attaching steps are desirably carried out at the same time. The attaching steps are desirably carried out by soldering. Where the die is desired to be insulated from the mounting portion, an insulator is included therebetween.

The above-summarized invention and objects and advantages will be more fully understood by considering the accompanying figures and description which follows.

DETAILED DESCRIPTION OF THE FIGURES

Figure 1A:
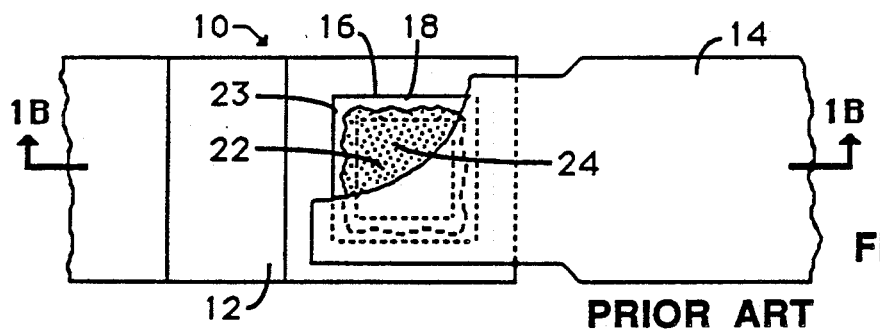
FIG. 1A shows a top and partial cut-away view of a portion of an electronic device according to the prior art and FIGS. 1B–C show cross-sectional views thereof.
Figure 1B:
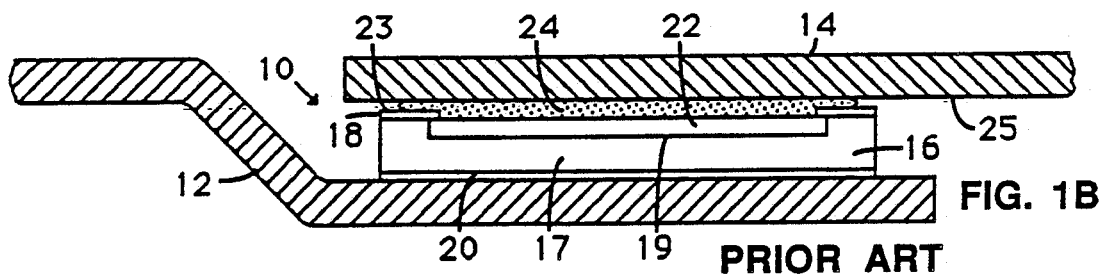
Figure 1C:
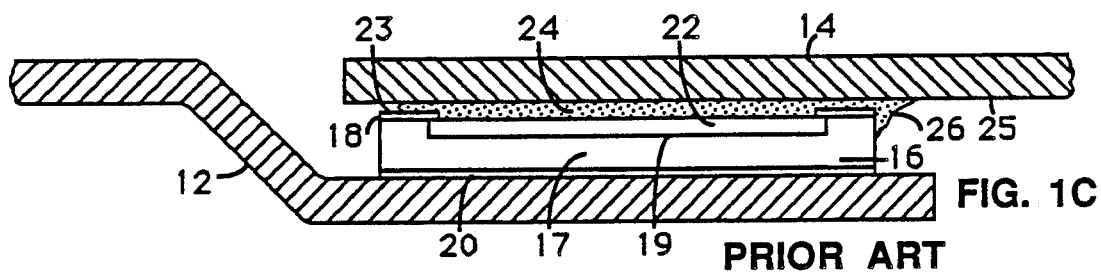

FIG. 1A shows a top and partial cutaway view and FIGS. 1B-C show cross-sectional views of a portion of an electronic device 10, according to the prior art. First electrode 12 has electronic die 16, e.g., a silicon rectifier chip, mounted thereon by attachment means 20. The opposite face of die 16 has contact 22 which is at least partly bordered by raised dielectric 18 having outer surface 23. Body 17 of die 16 may, for example, be a P-type semiconductor region and contact or bonding pad 22 may, for example, include an N-type semiconductor region, thereby forming PN junction 19 within die 16. Those of skill in the art will understand that the diode shown in die 16 is merely for purposes of illustration and so far as this invention is concerned, the internal structure of element 16 is of no concern and can be a diode, resistor, transistor, or other electronic structure, whether of a semiconductor type or not. For clarity, hatching has been omitted from the various regions of die 16 in the cross-sectional views of FIGS. 1B-4D and solder regions are stippled.

Contact 22 may be part of a region within the body of device 16 exposed on the surface, or a surface metallization, or may be an exposed portion of a conductive lead on the body of the device or on a dielectric layer on the device. Contact 22 may be doped semiconductor or metal or semi-metal or alloy or a combination thereof. The body may be semiconducting or insulating. So far as this invention is concerned it is only important that contact 22 be depressed or recessed with respect to an adjacent portion of the outer surface of die 16, for example, as shown in FIG. 1B where surface 23 of dielectric 18 adjacent to contact 22 extends to a greater elevation than contact 22.

Contact 22 is attached to lead means 14 by, for example, solder 24. Because prior art lead 14 is substantially flat, unless the amount of solder 24 and the spacing of lead 14 are precisely controlled, solder 24 will extend out onto upper surface 23 of dielectric 18. Because of variations in solder preforms used for such purposes and variations of the spacing between lead 14 and contact 22, it is common for excess solder to squeeze out from between contact 22 and lead 14 onto upper surface 23 of dielectric 18 and over the edge of die 16, as shown in location 26 in FIG. 1C. This can make the device inoperative by, for example, shorting out PN junction 19. Even if solder 24 does not extend so far as to short junction 19 but merely flows out over upper surface 23 of dielectric 18, this can adversely affect device reliability by decreasing the breakdown voltage for flashover from region 17 to solder 24 along the edge of the device. The propensity for such shorts or reduced breakdown voltage is exacerbated when solder 24 wets lead 14 and creeps the small gap between dielectric 18 and lead 14. Thus, yield loss and decreased reliability can occur with the prior art lead arrangement.

Figure 2A:
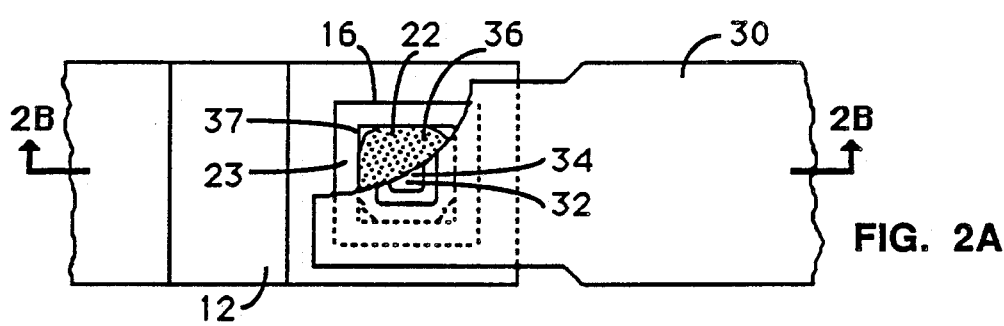
FIG. 2A shows a top and partial cut-away view of a portion of an electronic device according to a first embodiment of the present invention and FIG. 2B shows a cross-sectional view thereof.
Figure 2B:
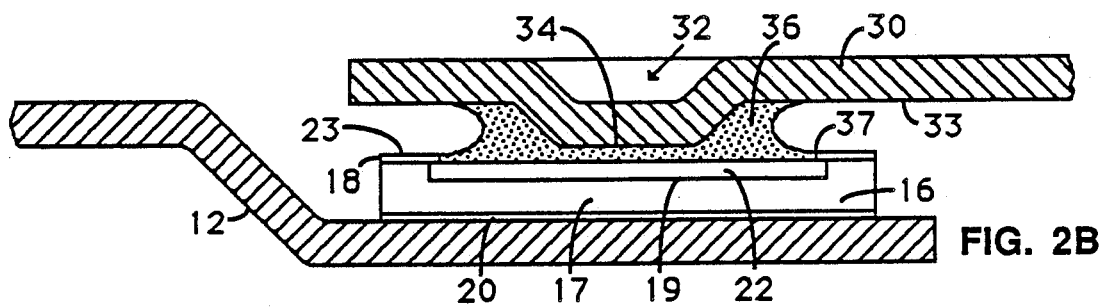

FIG. 2A shows a partial cutaway and top view and FIG. 2B shows a cross-sectional view through an improved device according to a first embodiment of the present invention which avoids many of the limitations of the prior art devices. First electrode 12 and die 16 with PN junction 19 between recessed contact region 22 and body 17, and with adjacent raised dielectric 18, having outer surface 23, are the same as illustrated for the prior art device in FIGS. 1A-C and are intended to be merely representative of the many different types of electronic devices (with or without PN junctions) which have recessed or depressed contact region on pad 22.

Upper lead 30 has convex dimple 32 with bottom portion 34 directed toward contact region 22 and attached thereto by solder region 36. Region 36 (and equivalent regions 46 and 56 in FIGS. 3B and 4B) may be a metallic solder or conductive plastic or glass or other electrical conductor, which are intended to be included in the general term solder as used herein.

It is important that bottom portion 34 of dimple 32 have lateral dimensions which are smaller than the lateral dimensions of contact 22, as shown for example in FIGS. 2A-B, and that the depth of bottom 34 of dimple 32 below lower surface 33 of lead 30 be greater than the depth by which contact 22 is recessed below outer surface 23 of raised dielectric 18. This helps to provide the proper shape to solder 36 and control its lateral extent.

When solder 36 is in a semi-liquid or liquid state, it can wet both contact 22 and undersurface 33 of lead 30. With good wetting the contact angle between solder 36 and both contact 22 and lower surface 33 of lead 30 is low and there is a strong tendency for the solder to creep laterally away from the central portion of contact 22. This is true even though the available volume of solder is limited. In the device of FIGS. 2A-B, the lateral migration of the edge of solder 36 is opposed by the surface tension in the solder material.

With the invented arrangement shown in FIGS. 2A-B, the increase in separation of lower surface 33 of lead 30 from contact 22 due to the presence of dimple 32 provides for a comparatively large, laterally concave outward, air-solder interface. Under these circumstances a component of the surface tension force in the air-solder interface surface opposes the surface migration force along the solder interface with lead 30. In the prior art device where the contact angle between the solder and dielectric surface 23 may be large, the air-solder interface between lead 14 and dielectric 18 may be laterally convex outward, in which case the surface tension aids rather than opposes the laterally outward migration force.

Thus, the invented arrangement is much easier to control in manufacturing and much more tolerant of differences in lead-contact spacing and variations of solder volume. This is aided by the large space available in the invented structure into which the solder can flow without extending onto upper surface 23 of dielectric 18.

It will be noted that solder 36 may contact sidewall 37 of dielectric 18 extending from upper surface 23 of dielectric 18 to contact region 22. This does no harm. Because the air-surface interface of solder 36 is directed laterally inward at this point, i.e. toward the center of contact 22, there is little tendency for solder 36 to creep over upper surface 23 of dielectric, even if solder 36 wets dielectric 18 since the surface tension of the air-solder interface opposes such migration.

A further advantage of the invented arrangement is that surface migration and surface tension forces encourage solder 36 to creep outward along contact region 22 and then upward along sidewall 37 so as to fill the recess above contact region 22. This provides the maximum area contact to region 22, which is highly desirable for reducing series electrical and thermal resistance between contact 22 and lead 30. The solder filling action tends to stop at the upper edge of dielectric sidewall 37, i.e., when the contact depression is filled, because at that point the surface tension component of the air-solder interface switches from aiding upward solder migration along sidewall 37 to opposing the outward migration of solder 36 along surface 23.

Figure 3A:
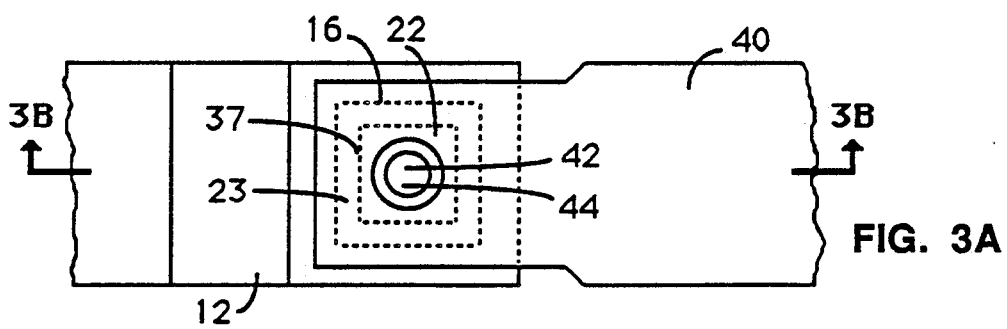
FIG. 3A shows a top view of a portion of an electronic device according to a further embodiment of the present invention and FIG. 3B shows a cross-sectional view thereof.
Figure 3B:
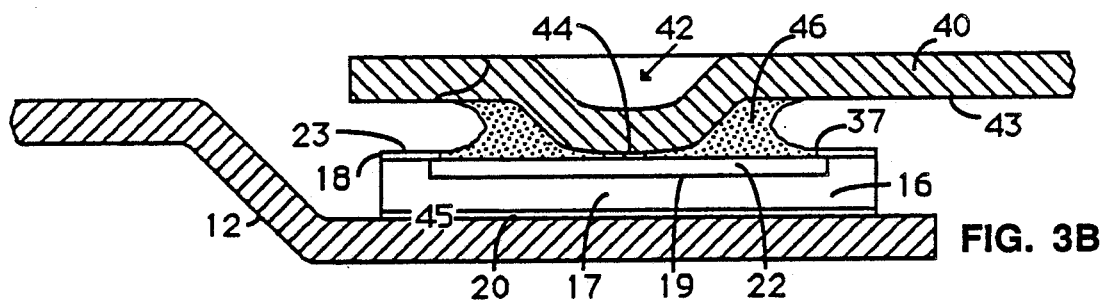

FIGS. 2A-B illustrate an embodiment where bottom 34 of dimple 32 is substantially flat. Such an arrangement provides a large surface area of lead 30 in close proximity to contact 22 which is desirable for improved surge performance, but requires more precise placement of the leads during assembly to insure that bottom 34 is parallel to contact 22. The arrangement shown in FIGS. 3A-B is more forgiving. FIGS. 3A-B are substantially the same as FIGS. 2A-B except that bottom 44 of dimple 42 in upper lead 40 is curved so that the distance between bottom 44 and contact region 22 increases monotonically as one moves laterally away from the center of dimple 42 toward adjacent dielectric 18. This embodiment possesses nearly all the advantages of the embodiment of FIGS. 2A-B plus the additional advantage of being less sensitive to mis-adjustments of the parallelness of leads 30, 40 and contact 22. With the arrangement of FIGS. 3A-B, bottom 44 of lead 40 has substantially the same relation to contact region 22 even if lead 40 is slightly off being parallel with surface 22, whereas bottom 34 of lead 30 would not.

FIGS. 2A-B illustrate the arrangement where dimple 32 is, when viewed from the top, substantially square or rectangular. FIGS. 3A-B illustrate the arrangement where dimple 42 is, when viewed from the top, substantially circular or oval and, in cross section, substantially hemi-spherical or hemi-ellipsoidal. As used herein, the term hemi-ellipsoidal is intended to include hemi-spherical.

The shape of dimple 32, 42 is not critical but it is desirable to avoid sharp edges or bends or regions of reduced thickness. It is desirable that the dimple conform approximately to the lateral shape of contact region 22 so as to encourage full coverage of contact area 22 by solder 36, 46 and that it have a slightly curved bottom profile as in the cross-sectional view of FIGS. 3B, 4B and/or 4D.

Figure 4A:
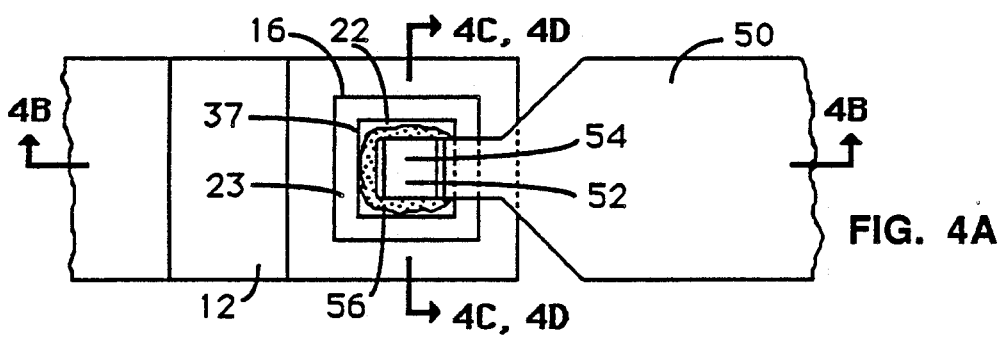
FIG. 4A shows a top view of a portion of an electronic device according to a still further embodiment of the present invention and FIGS. 4B–D shows cross-sectional views thereof according to several embodiments.
Figure 4C:
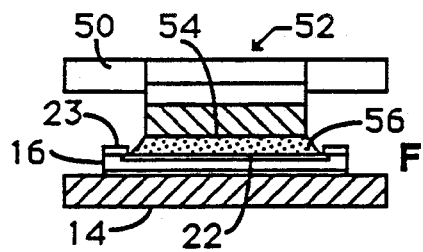
Figure 4D:
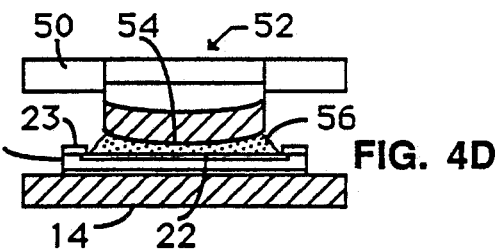
Figure 4B:
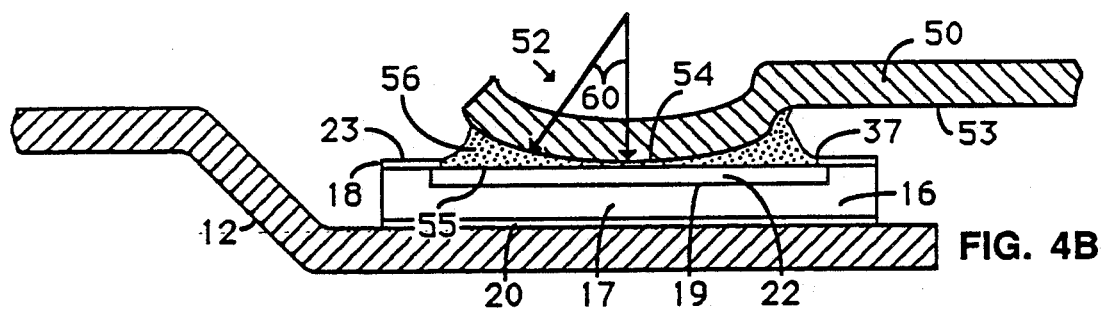

FIGS. 4A-B illustrate a further embodiment of the present invention wherein upper lead 50 is made narrower than contact region 22. Lead 50 has curved portion 52 with lower surface 54 which is bonded to contact region 22 by solder 56. By making curved portion 52 smaller than contact region 22, the solder may be easily constrained to stay within the contact region, even if contact portion 52 is slightly misaligned.

FIGS. 4C-D show cross-sectional views of the arrangement of FIGS. 4A-B according to further embodiments and at a right angle to FIG. 4B. FIG. 4C illustrates the arrangement in which curved portion 52 of lead 50 is curved substantially only in one direction, that is, curved in the plane of FIG. 4B but not curved in the plane of FIG. 4C. Thus, in this embodiment, curved portion 52 has a substantially cylindrical shape or other two dimensional curvature. This has the advantage of being especially easy to form with minimum drawing of the material of lead 50.

FIG. 4D illustrates the arrangement in which curved portion 52 of lead 50 is curved in two directions, i.e., curved in the plane of FIG. 4B and in the plane of FIG. 4D. Ordinarily the two planes of curvature are orthogonal, but this is not essential. In this embodiment, curved portion 52 has a substantially hemi-spherical or hemi-ellipsoidal shape or other three dimensional curvature. This has the advantage of being most forgiving regarding alignment of the die contact region and contact portion of the lead.

Radius of curvature 60 (see FIG. 4B) is desirably adjusted for different size contact regions 22 so that bottom surfaces 43, 44, and 53, 54 are far enough from upper surface 45, 55 of contact region 22 at the upper edge of sidewall 37 of dielectric 18 to avoid solder creep onto upper surface 23 of dielectric 18. Examples are described below which will provide those of skill in the art with sufficient information for choosing generally the best curvature of regions 42, 52 for different lateral dimensions of contact 22 without undue experimentation.

In the above described embodiments, die 16 has been electrically connected directly to lead 12, but this is not essential. Attachment means 20 may comprise an electrical insulator so that die 16 is, for example, thermally but not electrically coupled to lead 12 which provides mechanical support. Electrical connection to region 17 of die 16 may be made through other leads (not shown).

With respect to the choice of solder material it was found that metal alloy solders are particularly suitable but other solders are also believed to be useful. In choosing a solder it is important to choose materials that readily wet the electrical leads and which do not readily wet regions of the die adjacent to the bonding location where contact with the leads or solder is not wanted. Since the electrical leads are usually of high conductivity metals and adjacent die regions are often covered by a passivation dielectric, solders which preferentially wet such metals and do not significantly wet passivation dielectrics are preferred in such locations. In this respect metal alloy solders usually perform better than most conductive plastics or glasses of which we are aware.

EXAMPLE

Devices having the configuration shown substantially in FIGS. 3A-B and 4A-B were fabricated using silicon rectifier die of lateral dimension in the range of about 37 to 105 mils (0.94 to 2.7 mm) square. These die had a raised oxide edge substantially as shown in FIGS. 3B, 4B whose top surface was as much as about 0.5 mil (12 micrometers) above the level of the contact region or bonding pad. The bonding pad corresponding to region 22 in FIGS. 3B and 4B was doped silicon covered by Ti-Ni-Ag metallization. Lower lead 12 on which die 16 was mounted was of copper with lateral dimensions in the die mount region in the range of about 80×90 to 115×135 mils (2.0×2.3 to 2.9×3.4 mm) and had a thickness in the range of about 5 to 15 mils (0.13 to 0.38 mm) or larger, typically about 6 mils (0.15 mm). Upper lead 40, 50 was also of copper and had lateral dimensions in the die contact region in the range of about 40×40 to 100×100 mils (1×1 to 2.5×2.5 mm) for the configuration of FIGS. 3A-B and 20×20 to 80×80 mils (0.5×0.5 to 2×2 mm) for the configurations of FIGS. 4A-B and had a thickness generally in the range of 6 to 15 mils, (0.15 to 0.38 mm) or larger, typically 12 mils (0.3 mm). The curved shapes illustrated in FIGS. 3B and 4B were used.

Solder paste of for example, 88:10:2 (Pb:Sn:Ag) alloy in an amount of about 0.5 to 3.0 milligrams, depending on the die size, was placed on the die mount region of lead 12 and die 16 placed thereon. Other solder forms, alloys and amounts can also be used.

Solder paste of the same composition and in similar or smaller amounts was placed on upward facing die contact or pad 22 and upper lead 40, 50 was then formed or provided in contact therewith. The smaller the contact area, the smaller the amount of solder used.

The assembled parts were passed through a twenty foot long, two inch wide, four zone hydrogen atmosphere belt furnace manufactured by the Lindberg Company of Milwaukee, Wis. The parts moving along the belt were exposed to a peak temperature of about 340° C. for about three minutes in an atmosphere of hydrogen. This time and temperature were sufficient to melt the solder paste and obtain wetting of die contact region 22 and lead 40, 50 and of the reverse face of die 16 and the die bond region of lead 12. On completion of the soldering operation, the devices were cooled and inspected. It was found that excellent coverage of die contact region 22 was obtained without any encroachment of the solder onto the upper face of the adjacent dielectric and without edge shorting or other problems found in the prior art.

Curved portion 42, 52 of electrode 40, 50 which contacts region 22 has a radius of curvature of about 12–200 mils (0.3–5.1 mm). This is sufficient in combination with the lateral dimensions of pad 22 of about 29×29 to 94×94 mils (0.73×0.73 to 2.4×2.4 mm) to locate the underside of lead 40, 50 about 3–10 mils (0.076–0.25 mm) above dielectric 18 at the edge of contact region 22. It is desirable that a separation of at least about 6 mils (0.15 mm) be maintained between the under surface of upper lead 40, 50 and surface 23 of dielectric 18 as the die size, contact size and lead size are varied. This is accomplished by adjusting the radius of curvature and/or the dimple depth.

Having thus described the invention, those of skill in the art will understand that while the description has been made for purposes of explanation in terms of bonding to a silicon rectifier die, that the invention applies to any semiconductor die or any electronic die having a recessed contact region or pad to be contacted, for example, by a comparatively heavy lead, as opposed to a conventional wirebond, and where contact between the lead or attachment solder and the top surface of the adjacent raised dielectric, or another adjacent raised die region laterally outside the bonding pad, is to be avoided.

Further, those of skill in the art will appreciate that the above-described means and method eliminates the solder creep and solder shorting problems associated with prior art lead attachment methods and structures and that it does so in a particularly simple and convenient manner which contributes to improved yield and reliability in the finished device.

In addition, those of skill in the art will appreciate based on the teachings herein that various modifications and equivalents may be made to the means and method of the present invention without departing from the scope thereof. Accordingly, it is intended to include all such variations in the claims that follow.

We claim:

1. A semiconductor device comprising:
    a semiconductor die having first and second opposed faces, wherein the second face of the semiconductor die has a bonding pad having a first elevation relative to the second face of the semiconductor die, wherein the bonding pad is laterally adjacent to a dielectric part of whose outer surface has an elevation above the second face of the semiconductor die greater than the elevation of the bonding pad;
    first lead means having a first portion for permitting an external contact to the device and a second portion coupled to the first portion for mounting the first face of the semiconductor die;
    second lead means having a first portion for permitting external contact to the device and a second bonding portion coupled thereto for electrical connection to the second face of the semiconductor die at the bonding pad;
    wherein the bonding portion of the second lead means is convexly curved toward the bonding pad, in at least one direction, so that when connected thereto the distance from the bonding portion to the bonding pad increases when moving in a lateral direction from a part of the bonding portion closest to the bonding pad toward the laterally adjacent dielectric; and
    wherein the convexly curved bonding portion of the second lead means is attached to the bonding pad by a liquefiable electrically conducting bonding material.

2. The device of claim 1 wherein the distance from the bonding portion to the bonding pad increases monotonically.

3. The device of claim 2 wherein the bonding material contacts substantially the entire bonding pad.

4. The device of claim 3 wherein the distance from the bonding portion to the bonding pad is measured through the bonding material.

5. The device of claim 3 wherein the part of the outer surface of the adjacent dielectric is substantially parallel to the second face of the semiconductor die and the bonding material does not extend in contact with the part of the outer surface of the adjacent dielectric.

6. The device of claim 1 wherein the bonding portion is convexly curved in at least two directions.

7. The device of claim 1 wherein the part of the bonding portion closest to the bonding pad has substantially a hemi-ellipsoidal shape.

8. A semiconductor device comprising:
    a semiconductor die having first and second opposed faces, the first face being substantially flat and the second face having thereon at least one electrical bonding pad at least partially surrounded by a raised dielectric region higher than the bonding pad and having an upper face extending laterally away from the bonding pad;
    first and second mounting means having external portions for contact to the device and internal portions for connection, respectively, to the first and second faces of the semiconductor die, wherein the internal portion of the second mounting means has a region that is partly dimpled in a direction toward the at least one bonding pad and electrically connected thereto by a liquefiable electrically conductive material not extending substantially onto the upper face of the dielectric.

9. The device of claim 8 wherein the partly dimpled region of the internal portion of the second mounting means is curved in at least one direction.

10. The device of claim 8 wherein the partly dimpled region of the internal portion of the second mounting means is curved in at least two directions.

11. The device of claim 8 wherein the distance between the bonding pad and a point of closest approach of the dimpled region to the bonding pad increases monotonically as one moves laterally from the point of closest approach toward the at least partially surrounding dielectric.

12. The device of claim 8 wherein the dimpled region has a substantially hemi-cylindrical shape.

13. The device of claim 8 wherein the dimpled region has a substantially hemi-ellipsoidal shape.

14. The device of claim 8 further comprising an insulating region between the die and the first mounting means.

* * * * *